United States Patent
Li et al.

(10) Patent No.: US 9,577,308 B2
(45) Date of Patent: Feb. 21, 2017

(54) INTERCONNECTING STRUCTURE FOR ELECTRICALLY CONNECTING A FIRST ELECTRONIC DEVICE WITH A SECOND ELECTRONIC DEVICE

(71) Applicant: National Chiao Tung University, Hscinchu (TW)

(72) Inventors: Chun-Hsing Li, Hsinchu (TW); Chien-Nan Kuo, Hsinchu (TW); Chun-Lin Ko, Hsinchu (TW)

(73) Assignee: NATIONAL CHAIO TUNG UNIVERSITY (TW)

( * ) Notice: Subject to any disclaimer, the term of this patent is extended or adjusted under 35 U.S.C. 154(b) by 231 days.

(21) Appl. No.: 14/204,694

(22) Filed: Mar. 11, 2014

(65) Prior Publication Data
US 2015/0068024 A1 Mar. 12, 2015

(30) Foreign Application Priority Data
Sep. 12, 2013 (TW) .............................. 102133052 A (51) Int. Cl.
| | |
|---|---|
| *H01P 5/02* | (2006.01) |
| *H01P 1/04* | (2006.01) |
| *H01L 23/00* | (2006.01) |
| *H01P 3/02* | (2006.01) |
| *H01L 23/64* | (2006.01) |

(52) U.S. Cl.
CPC ................. *H01P 5/02* (2013.01); *H01L 24/49* (2013.01); *H01P 1/04* (2013.01); *H01L 23/64* (2013.01); *H01L 2224/49175* (2013.01); *H01L 2924/00014* (2013.01); *H01P 3/026* (2013.01); *H01P 5/028* (2013.01); *Y10T 29/49002* (2015.01)

(58) Field of Classification Search
CPC ...... H01L 23/64; H01L 24/49; H01L 2224/49; H01L 2224/49175; H01L 2924/00014; H01P 3/026; H01P 5/028; H01P 5/02; H01P 1/04; Y10T 29/49002
USPC ............ 333/1, 4, 5, 12, 100, 24 R, 238, 246
See application file for complete search history.

(56) References Cited

U.S. PATENT DOCUMENTS

| | | | |
|---|---|---|---|
| 7,030,490 B2 * | 4/2006 | Lee ........................ | H01L 23/66 257/728 |
| 7,227,430 B2 | 6/2007 | Gill et al. | |
| 7,242,266 B2 | 7/2007 | Peterson | |

* cited by examiner

*Primary Examiner* — Benny Lee
*Assistant Examiner* — Jorge Salazar, Jr.
(74) *Attorney, Agent, or Firm* — Volpe and Koenig, P.C.

(57) ABSTRACT

An interconnecting structure for electrically connecting a first electronic device with a second electronic device is provided. The first electronic device has two first bond-pads, and the second electronic device has two second bond-pads electrically connected to the two first bond-pads respectively. The interconnecting structure includes a signal transmission structure electrically connected to the two first bond-pads and the two second bond-pads; and a ground device disposed between the first electronic device and the second electronic device so that the first electronic device and the second electronic device have a same ground potential.

8 Claims, 12 Drawing Sheets

US 9,577,308 B2

INTERCONNECTING STRUCTURE FOR ELECTRICALLY CONNECTING A FIRST ELECTRONIC DEVICE WITH A SECOND ELECTRONIC DEVICE

CROSS-REFERENCE TO RELATED APPLICATION AND CLAIM OF PRIORITY

The application claims the benefit of Taiwan Patent Application No. 102133052, filed on Sep. 12, 2013, in the Taiwan Intellectual Property Office, the disclosures of which are incorporated herein in their entirety by reference.

FIELD OF THE INVENTION

The present invention relates to an interconnecting structure, and more particularly to an interconnecting structure for electrically connecting a first electronic device with a second electronic device.

BACKGROUND OF THE INVENTION

Generally, compared to the way of bondwire connection, the cost of the interconnecting structure for connecting a chip with another chip or for connecting a chip with a carrier, such as the ribbon interconnecting structure or the flip-chip packaging, is higher. However, due to the high inductance of the bondwire itself, the operational bandwidth is quite narrow, usually below 30 GHz. Therefore, in the application of a higher frequency, e.g. 60 GHz WiGig, the bondwire cannot be used as the interconnecting structure for connecting a chip with another chip. Usually, there are two ways to solve the high inductance issue of the bondwire. The first way is to use the bondwire having a shorter length. However, the length of the bondwire is limited to the interval or height between chips or between the chip and the carrier, so the bandwidth is still limited. The second way is to dispose a plurality of bondwires on a bond-pad to reduce the inductance effect of the bondwire. However, the mutual inductance between bondwires is increased so that the equivalent inductance value cannot be reduced. Hence, the actual effect is still limited.

Using the bondwire and the plate capacitor on the chip or carrier to realize a multistage low pass filter is another commonly used interconnecting structure for connecting a chip with another chip or for connecting a chip with a carrier. However, such interconnecting structure consumes a quite large area, and does not consider and design the interconnecting structure of the ground between chips or between the chip and the carrier. Therefore, such interconnecting structure is unfeasible in practice. Another way is to use the plate capacitor on the carrier, in cooperation with the bondwire, to generate the L-C-L (inductor-capacitor-inductor) equivalent circuit. However, this way results in a quite narrow operational bandwidth and consumes the area, which is not practical.

The U.S. Pat. No. 7,242,266 uses the tapered and stepped transmission lines, in cooperation with the bondwire, to reduce the inductance effect of the bondwire. However, the structure used consumes a large area, and the cost thereof is high. In addition, the interconnecting structure of the ground between chips or between the chip and the carrier is not designed. Therefore, this patent is unfeasible in practice.

The U.S. Pat. No. 7,227,430 uses the transmission lines and the open stub to reduce the inductance effect of the bondwire. However, this patent consumes a considerable number of transmission lines and a large area, and the cost thereof is high. Moreover, the interconnecting structure of the ground between chips or between the chip and the carrier is not designed. Therefore, this patent is unfeasible in practice.

In order to overcome the drawbacks in the prior art, an interconnecting structure for electrically connecting a first electronic device with a second electronic device is provided. The particular design in the present invention not only solves the problems described above, but also is easy to be implemented. Thus, the present invention has the utility for the industry.

SUMMARY OF THE INVENTION

In accordance with an aspect of the present invention, an interconnecting structure for electrically connecting a first electronic device with a second electronic device is provided. The first electronic device has two first bond-pads, and the second electronic device has two second bond-pads electrically connected to the two first bond-pads respectively. The interconnecting structure includes a signal transmission structure electrically connected to the two first bond-pads and the two second bond-pads; and a ground device disposed between the first electronic device and the second electronic device so that the first electronic device and the second electronic device have a same ground potential.

In accordance with another aspect of the present invention, an electronic device for being electrically connected to an electronic element is provided. The electronic device has two first bond-pads, and the electronic element has two second bond-pads electrically connected to the two first bond-pads respectively. The electronic device includes a signal transmission structure electrically connected to the two first bond-pads and the two second bond-pads.

In accordance with a further aspect of the present invention, an interconnecting structure for electrically connecting a first electronic device with a second electronic device is provided. The first electronic device has two first bond-pads, and the second electronic device has two second bond-pads electrically connected to the two first bond-pads respectively. The interconnecting structure includes a ground device disposed between the first electronic device and the second electronic device so that the first electronic device and the second electronic device have a same ground potential.

In accordance with further another aspect of the present invention, a method for electrically connecting a first electronic device with a second electronic device is provided. The first electronic device has a first ground potential and the second electronic device has a second ground potential. The method includes steps of causing the first ground potential to be equal to the second ground potential; providing N transmission lines and (N+1) first bond-pads in the first electronic device, wherein the N transmission lines are disposed between the (N+1) first bond-pads, and N is a positive integer; providing M transmission lines and (M+1) second bond-pads in the second electronic device, wherein the M transmission lines are disposed between the (M+1) second bond-pads, and M is equal to N; and electrically connecting the (N+1) first bond-pads with the (M+1) second bond-pads respectively.

The above objects and advantages of the present invention will become more readily apparent to those ordinarily

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1A:
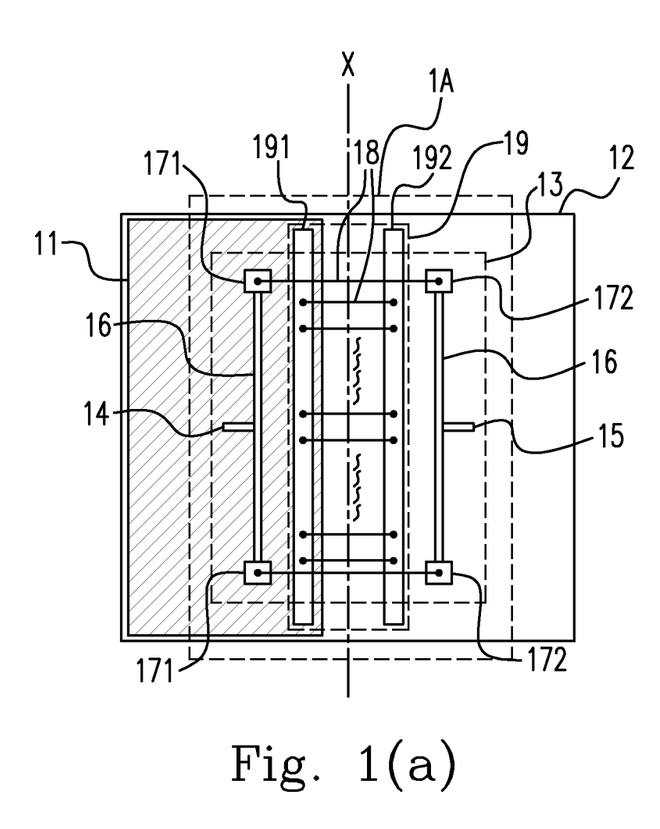
FIGS. 1(a)-1(c) show an interconnecting structure according to a first embodiment of the present invention.
Figure 1B:
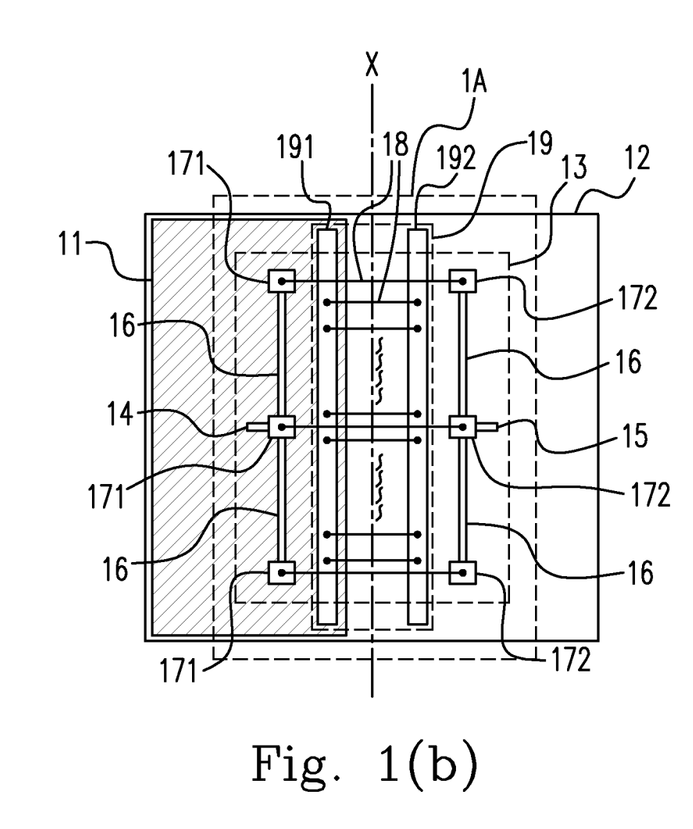
Figure 1C:
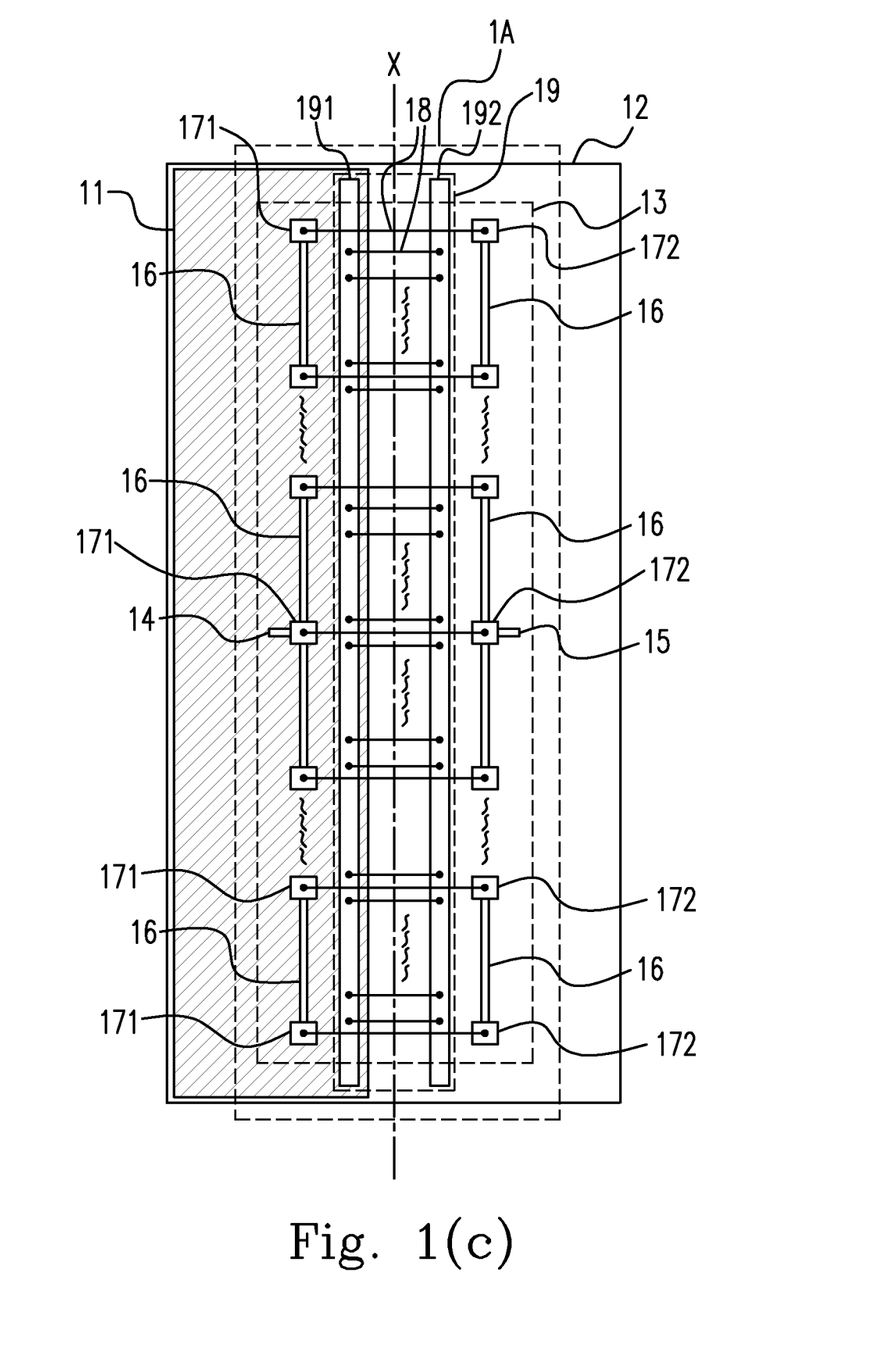

Please refer to FIGS. 1(a)-1(c), which show an interconnecting structure 1A according to a first embodiment of the present invention. The interconnecting structure 1A includes a signal transmission structure 13 and a ground device 19. The signal transmission structure 13 includes two transmission lines 16, a first signal input/output terminal 14, a second signal input/output terminal 15 and two bondwires 18 for transmitting the signal. The ground device 19 includes a first ground bond-pad 191, a second ground bond-pad 192 and at least one bondwire 18 for being connected to the ground. In FIG. 1(a), a first electronic device 11 is a chip, i.e. the rectangle represented by oblique lines, which includes two first bond-pads 171. A second electronic device 12 is a carrier, which includes two second bond-pads 172. Please refer to FIG. 1(a). The signal transmission structure 13 is disposed between the first electronic device 11 and the second electronic device 12 for electrically connecting the first electronic device 11 with the second electronic device 12. In this embodiment, the transmission lines 16 are disposed on the first electronic device 11 and the second electronic device 12 respectively. As shown in FIG. 1(a), a pair of transmission lines 16 are symmetrically disposed with respect to the X line, wherein one transmission line 16 is electrically connected between the first bond-pads 171 of the first electronic device 11, and the other is electrically connected between the second bond-pads 172 of the second electronic device 12. The first signal input/output terminal 14 is electrically connected to the central node of the transmission line 16 of the first electronic device 11. The second signal input/output terminal 15 is electrically connected to the central node of the transmission line 16 of the second electronic device 12. The first signal input/output terminal 14 and the second input/output terminal 15 are used to input and output the signal. The first bond-pads 171 on the first electronic device 11 are connected to the second bond-pads 172 on the second electronic device 12 via at least one bond-wire 18. Please refer to FIG. 1(b). In FIG. 1(b), two pairs of transmission lines 16 are symmetrically disposed with respect to the X line. In this embodiment, the first signal input/output terminal 14 is disposed on the first bond-pad 171 at the center of the bond-pad structure, and the second signal input/output terminal 15 is disposed on the second bond-pad 172 at the center of the bond-pad structure. Please refer to FIG. 1(c). In FIG. 1(c), N pairs of transmission lines 16 are symmetrically disposed with respect to the X line. That is, N transmission lines 16 are disposed between (N+1) first bond-pads 171, and N transmission lines 16 are also disposed between (N+1) second bond-pads 172. In this embodiment, the first signal input/output terminal 14 is disposed on the first bond-pad 171 at the center of the bond-pad structure, and the second signal input/output terminal 15 is disposed on the second bond-pad 172 at the center of the bond-pad structure. The present invention reduces the inductive effect by disposing the transmission lines 16. Generally, using the bond-wire 18 only will result in the high impedance at the high frequency so that the signal cannot be transmitted. However, adding the transmission lines 16 can reduce such effect. In FIGS. 1(a)-1(c), the ground device 19 is disposed on the first electronic device 11 and the second electronic device 12. The ground device 19 includes one first ground bond-pad 191 and one second ground bond-pad 192. The first ground bond-pad 191 on the first electronic device 11 is connected to the second ground bond-pad 192 on the second electronic device 12 via at least one bond-wire 18. The ground device 19 can cause the ground potential of the first electronic device 11 to be equal to that of the second electronic device 12. The interconnecting structure 1A of the present invention can significantly reduce the inductivity of the bond-wire 18 so that an interconnecting structure having a wider band can be obtained. In addition, the number of the transmission lines 16 used can be determined according to the length of the bond-wire 18. The length of the bond-wire 18 is determined according to the distance between the first electronic device 11 and the second electronic device 12. The larger the number of the transmission lines 16 is, the longer the length of the bond-wire 18 is.

Figure 2A:
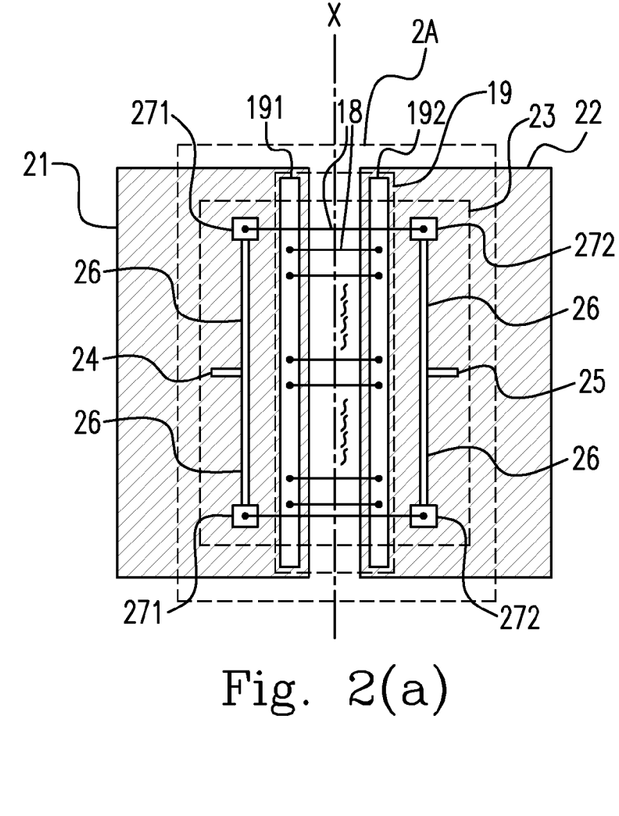
FIGS. 2(a)-2(c) show an interconnecting structure according to a second embodiment of the present invention.
Figure 2B:
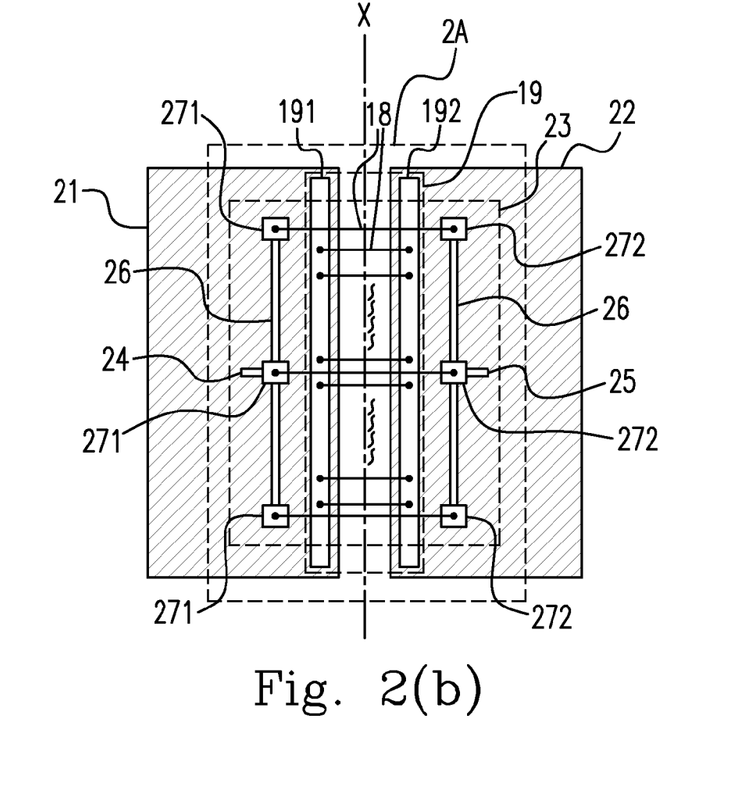
Figure 2C:
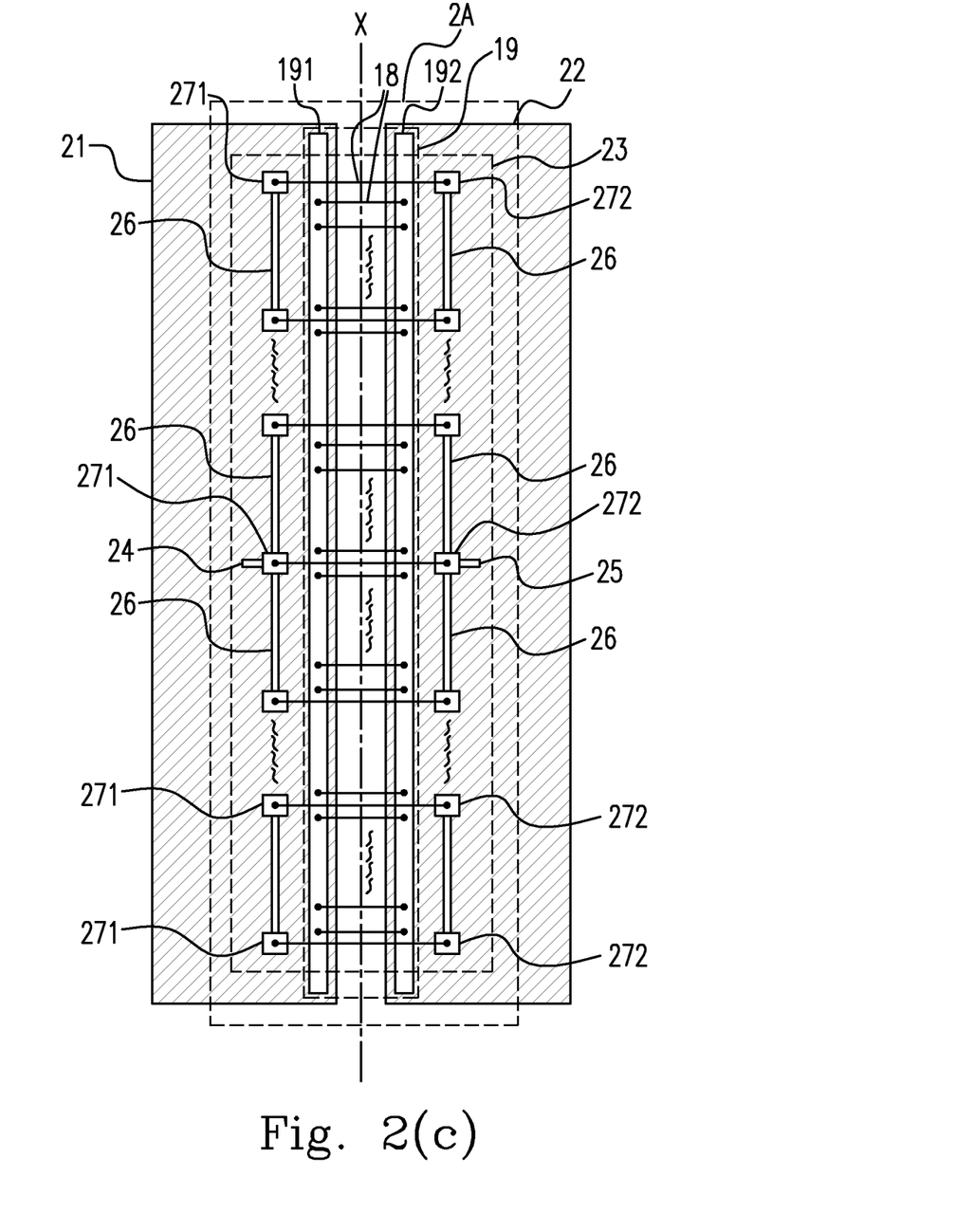

Please refer to FIGS. 2(a)-2(c), which show an interconnecting structure 2A according to a second embodiment of the present invention. The interconnecting structure 2A includes a signal transmission structure 23 and a ground device 19. The signal transmission structure 23 includes two transmission lines 26, a first signal input/output terminal 24, a second signal input/output terminal 25 and at least two bondwires 18 for transmitting the signal. The ground device 19 includes a first ground bond-pad 191, a second ground bond-pad 192 and at least one bondwire 18 for being connected to the ground. In FIG. 2(a), the interconnecting structure 2A is applied to the chip-to-chip signal transmission. A first electronic device 21 and a second electronic device 22 are both chips, i.e. the two rectangles represented by oblique lines. The first electronic device 21 includes two first bond-pads 271, and the second electronic device 22 includes two second bond-pads 272. Please refer to FIG. 2(a), which shows an example of a pair of transmission lines 26. The signal transmission structure 23 is disposed between the first electronic device 21 and the second electronic device 22 for electrically connecting the first electronic device 21 with the second electronic device 22. In this embodiment, the transmission lines 26 are disposed on the first electronic device 21 and the second electronic device 22 respectively. As shown in FIG. 2(a), a pair of transmission lines 26 are symmetrically disposed with respect to the X line, wherein one transmission line 26 is electrically connected between the first bond-pads 271 of the first electronic device 21, and the other is electrically connected between the second bond-pads 272 of the second electronic device 22. The first signal input/output terminal 24 is electrically connected to the central node of the transmission line 26 of the first electronic device 21. The second signal input/output terminal 25 is electrically connected to the central node of the transmission line 26 of the second electronic device 22. The first signal input/output terminal 24 and the second input/output terminal 25 are used to input and output the signal. The first bond-pads 271 on the first electronic device 21 are connected to the second bond-pads 272 on the second electronic device 22 via at least one bond-wire 18. Please refer to FIG. 2(*b*). In FIG. 2(*b*), two pairs of transmission lines 26 are symmetrically disposed with respect to the X line. In this embodiment, the first signal input/output terminal 24 is disposed on the first bond-pad 271 at the center of the bond-pad structure, and the second signal input/output terminal 25 is disposed on the second bond-pad 272 at the center of the bond-pad structure. Please refer to FIG. 2(*c*), which shows an example of N pairs of transmission lines 26. In FIG. 1(*c*), N pairs of transmission lines 26 are symmetrically disposed with respect to the X line. That is, N transmission lines 26 are disposed between (N+1) first bond-pads 271, and N transmission lines 26 are also disposed between (N+1) second bond-pads 272. In this embodiment, the first signal input/output terminal 24 is disposed on the first bond-pad 271 at the center of the bond-pad structure, and the second signal input/output terminal 25 is disposed on the second bond-pad 272 at the center of the bond-pad structure. In FIGS. 2(*a*)-2(*c*), the ground device 19 is disposed on the first electronic device 21 and the second electronic device 22. The ground device 19 includes one first ground bond-pad 191 and one second ground bond-pad 192. The first ground bond-pad 191 on the first electronic device 21 is connected to the second ground bond-pad 192 on the second electronic device 22 via at least one bond-wire 18. The ground device 19 can cause the ground potential of the first electronic device 21 to be equal to that of the second electronic device 22.

Figure 3A:
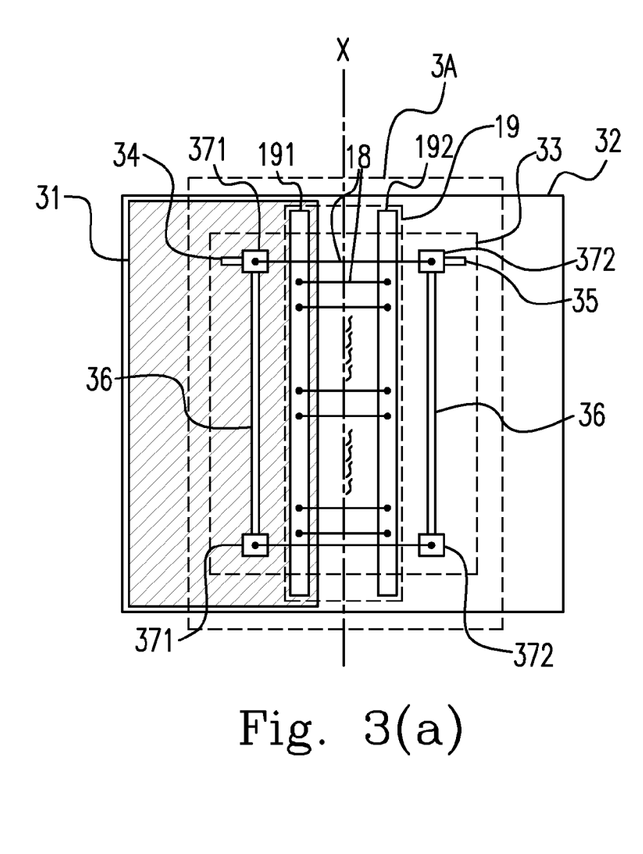
FIGS. 3(a)-3(c) show an interconnecting structure according to a third embodiment of the present invention.
Figure 3B:
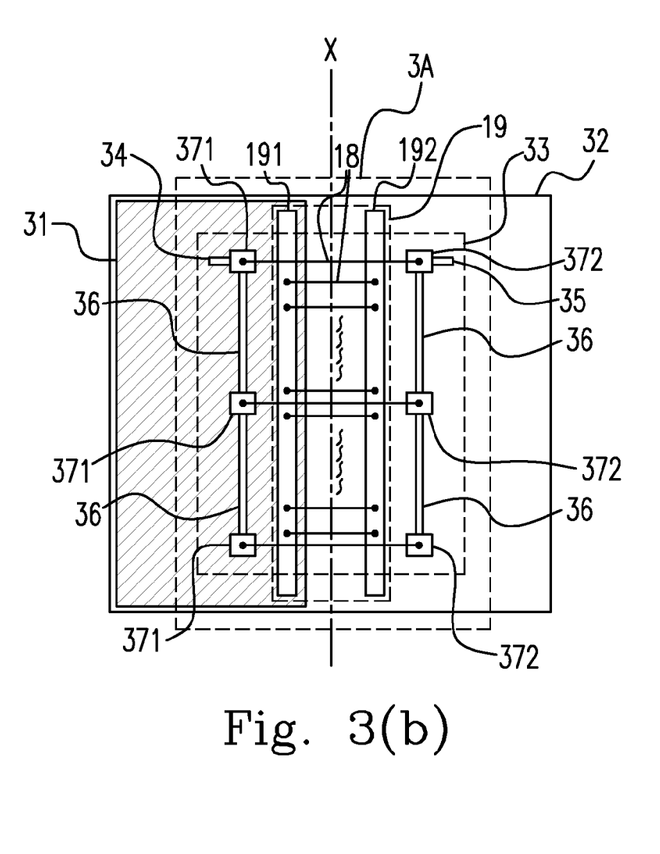
Figure 3C:
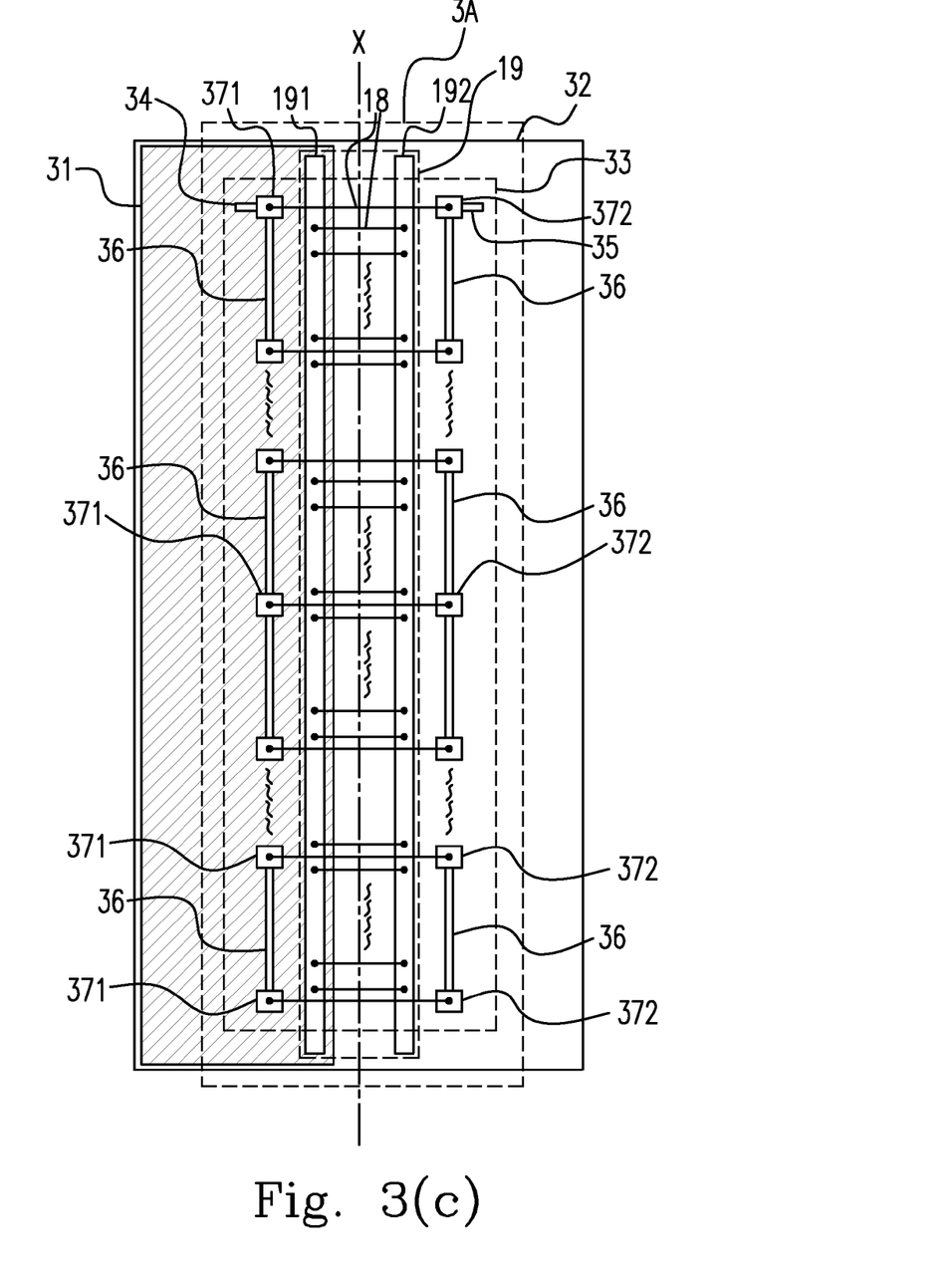

Please refer to FIGS. 3(*a*)-3(*c*), which show an interconnecting structure 3A according to a third embodiment of the present invention. The interconnecting structure 3A includes a signal transmission structure 33 and a ground device 19. The signal transmission structure 33 includes two transmission lines 36, a first signal input/output terminal 34, a second signal input/output terminal 35 and at least two bondwires 18 for transmitting the signal. The ground device 19 includes a first ground bond-pad 191, a second ground bond-pad 192 and at least one bondwire 18 for being connected to the ground. In FIG. 3(*a*), a first electronic device 31 is a chip, i.e. the rectangle represented by oblique lines, which includes two first bond-pads 371. A second electronic device 32 is a carrier, which includes two second bond-pads 372. Please refer to FIG. 3(*a*), which shows an example of a pair of transmission lines 36. The signal transmission structure 33 is disposed between the first electronic device 31 and the second electronic device 32 for electrically connecting the first electronic device 31 with the second electronic device 32. In this embodiment, the transmission lines 36 are disposed on the first electronic device 31 and the second electronic device 32 respectively. As shown in FIG. 3(*a*), a pair of transmission lines 36 are symmetrically disposed with respect to the X line, wherein one transmission line 36 is electrically connected between the first bond-pads 371 of the first electronic device 31, and the other is electrically connected between the second bond-pads 372 of the second electronic device 32. The first signal input/output terminal 34 is electrically connected to the first bond-pad 371 at the upper side of the interconnecting structure 3A. The second signal input/output terminal 35 is electrically connected to the second bond-pad 372 at the upper side of the interconnecting structure 3A. The first signal input/output terminal 34 and the second input/output terminal 35 are used to input and output the signal. The first bond-pads 371 on the first electronic device 31 are connected to the second bond-pads 372 on the second electronic device 32 via at least one bond-wire 18. Please refer to FIG. 3(*b*). In FIG. 3(*b*), two pairs of transmission lines 36 are symmetrically disposed with respect to the X line. In this embodiment, the respective dispositions of the first signal input/output terminal 34 and the second input/output terminal 35 are identical to those in FIG. 3(*a*). Please refer to FIG. 3(*c*), which shows an example of N pairs of transmission lines 36. In FIG. 3(*c*), N pairs of transmission lines 36 are symmetrically disposed with respect to the X line. That is, N transmission lines 36 are disposed between (N+1) first bond-pads 371, and N transmission lines 36 are also disposed between (N+1) second bond-pads 372. In this embodiment, the respective dispositions of the first signal input/output terminal 34 and the second input/output terminal 35 are identical to those in FIG. 3(*a*). In FIGS. 3(*a*)-3(*c*), the ground device 19 is disposed on the first electronic device 31 and the second electronic device 32. The ground device 19 includes one first ground bond-pad 191 and one second ground bond-pad 192. The first ground bond-pad 191 on the first electronic device 31 is connected to the second ground bond-pad 192 on the second electronic device 32 via at least one bond-wire 18. The ground device 19 can cause the ground potential of the first electronic device 31 to be equal to that of the second electronic device 32.

Figure 4A:
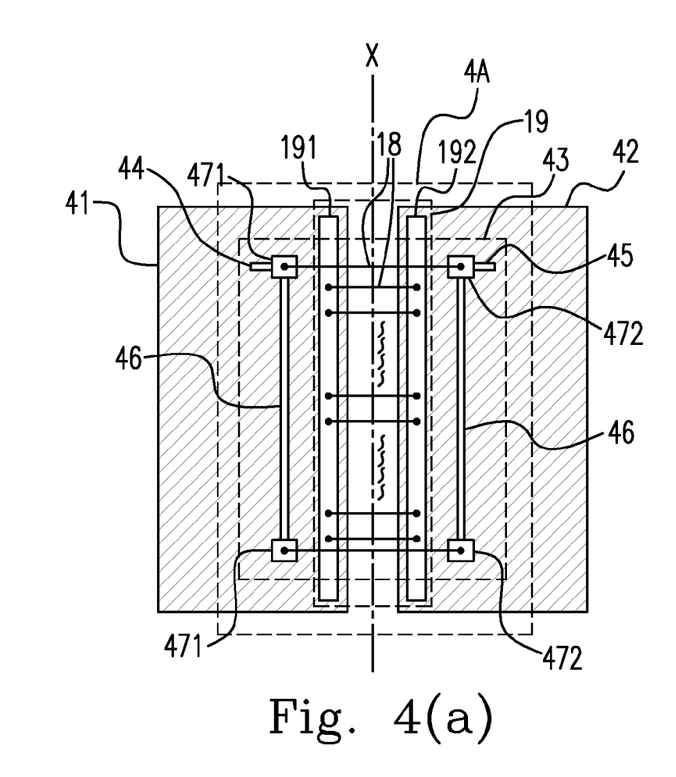
FIGS. 4(a)-4(c) show an interconnecting structure according to a fourth embodiment of the present invention.
Figure 4B:
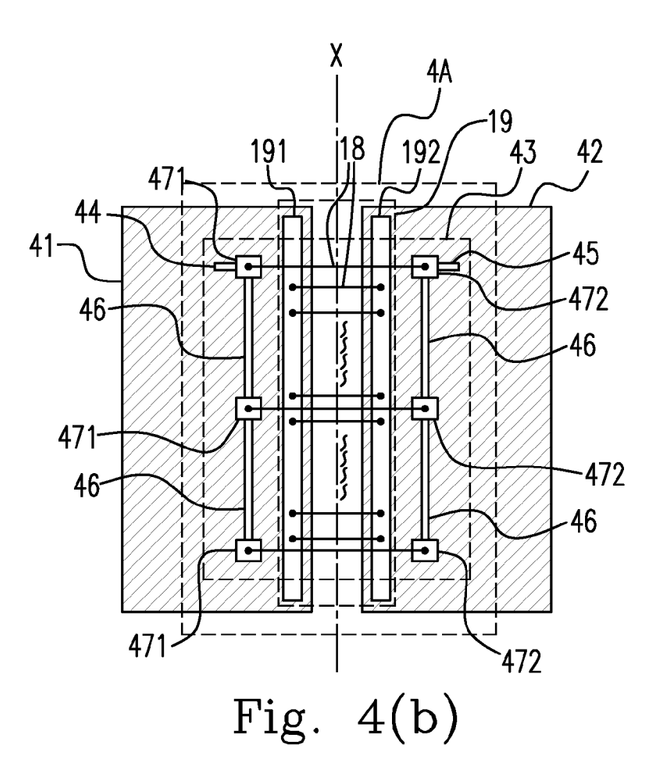
Figure 4C:
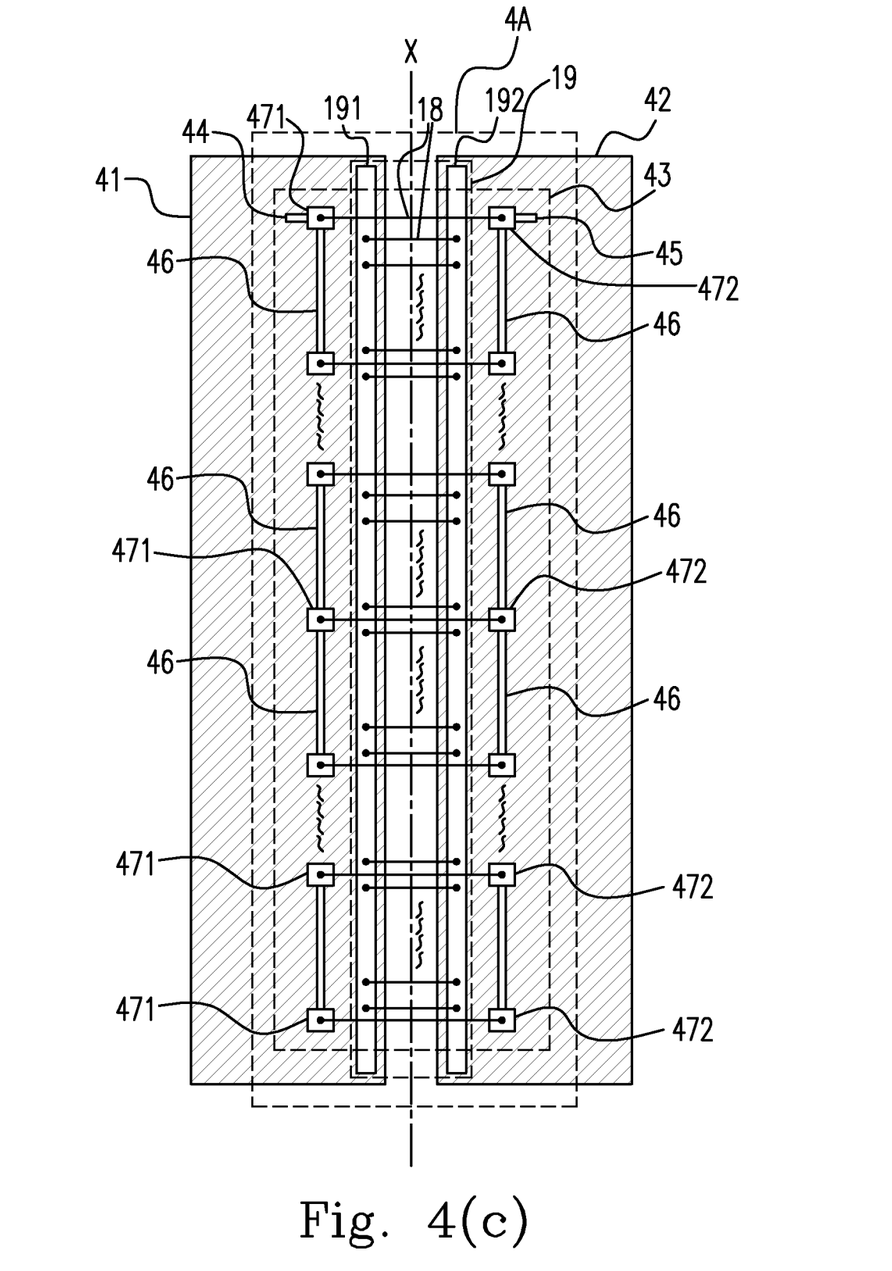

Please refer to FIGS. 4(*a*)-4(*c*), which show an interconnecting structure 4A according to a fourth embodiment of the present invention. The interconnecting structure 4A includes a signal transmission structure 43 and a ground device 19. The signal transmission structure 43 includes two transmission lines 46, a first signal input/output terminal 44, a second signal input/output terminal 45 and at least two bondwires 18 for transmitting the signal. The ground device 19 includes a first ground bond-pad 191, a second ground bond-pad 192 and at least one bondwire 18 for being connected to the ground. In FIG. 4(*a*), a first electronic device 41 and a second electronic device 42 are both chips, i.e. the two rectangles represented by oblique lines. The first electronic device 41 includes two first bond-pads 471, and the second electronic device 42 includes two second bond-pads 472. Please refer to FIG. 4(*a*), which shows an example of a pair of transmission lines 46. The signal transmission structure 43 is disposed between the first electronic device 41 and the second electronic device 42 for electrically connecting the first electronic device 41 with the second electronic device 42. In this embodiment, the transmission lines 46 are disposed on the first electronic device 41 and the second electronic device 42 respectively. As shown in FIG. 4(*a*), a pair of transmission lines 46 are symmetrically disposed with respect to the X line, wherein one transmission line 46 is electrically connected between the first bond-pads 471 of the first electronic device 41, and the other is electrically connected between the second bond-pads 472 of the second electronic device 42. The first signal input/output terminal 44 is electrically connected to the first bond-pad 471 at the upper side of the interconnecting structure 4A. The second signal input/output terminal 45 is electrically connected to the second bond-pad 472 at the upper side of the interconnecting structure 4A. The first signal input/output terminal 44 and the second input/output terminal 45 are used to input and output the signal. The first bond-pads 471 on the first electronic device 41 are connected to the second bond-pads 472 on the second electronic device 42 via at least one bond-wire 18. Please refer to FIG. 4(*b*). In FIG. 4(*b*), two pairs of transmission lines 46 are symmetrically disposed with respect to the X line. In this embodiment, the respective dispositions of the first signal input/output terminal 44 and the second input/output terminal 45 are identical to those in FIG. 4(*a*). Please refer to FIG. 4(*c*), which shows an example of N pairs of transmission lines 46. In FIG. 4(*c*), N pairs of transmission lines 46 are symmetrically disposed with respect to the X line. That is, N transmission lines 46 are disposed between (N+1) first bond-pads 471, and N transmission lines 46 are also disposed between (N+1) second bond-pads 472. In this embodiment, the respective dispositions of the first signal input/output terminal 44 and the second input/output terminal 45 are identical to those in FIG. 4(*a*). In FIGS. 4(*a*)-4(*c*), the ground device 19 is disposed on the first electronic device 41 and the second electronic device 42. The ground device 19 includes one first ground bond-pad 191 and one second ground bond-pad 192. The first ground bond-pad 191 on the first electronic device 41 is connected to the second ground bond-pad 192 on the second electronic device 42 via at least one bond-wire 18. The ground device 19 can cause the ground potential of the first electronic device 41 to be equal to that of the second electronic device 42.

Figure 5A:
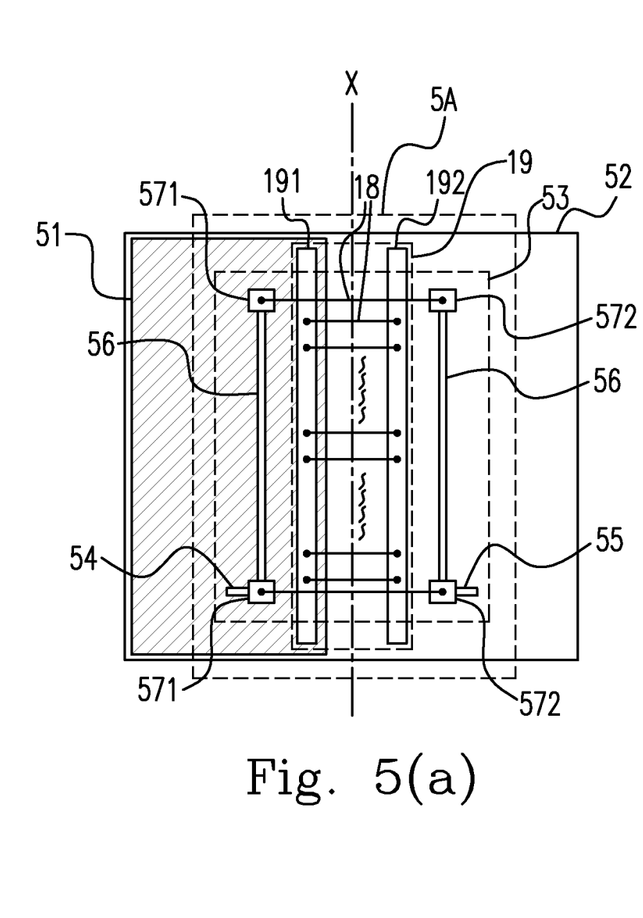
FIGS. 5(a)-5(c) show an interconnecting structure according to a fifth embodiment of the present invention.
Figure 5B:
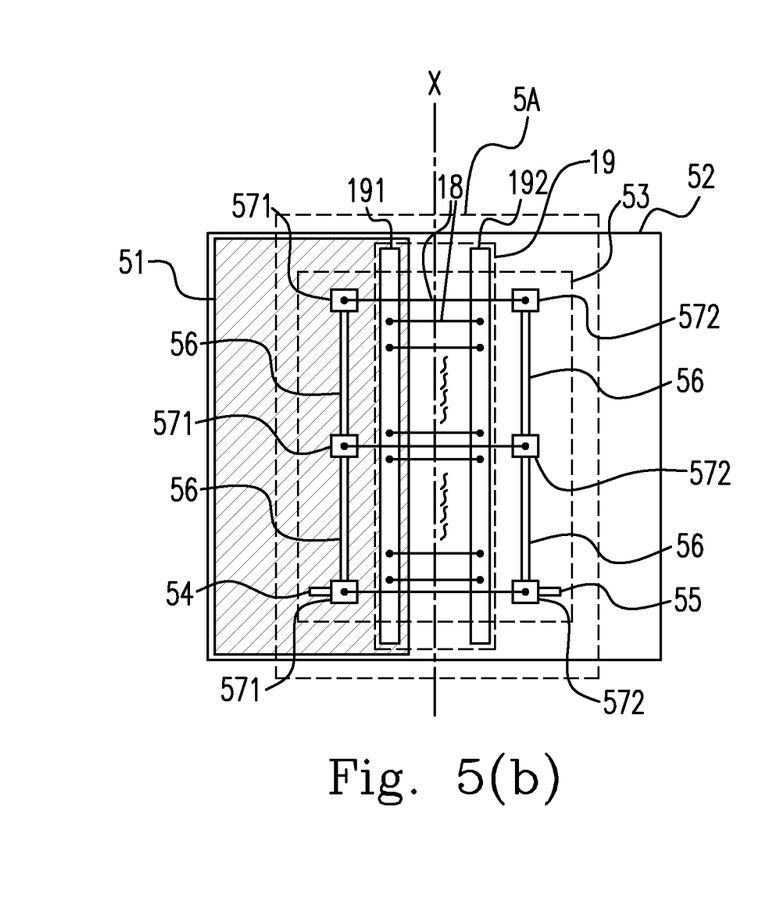
Figure 5C:
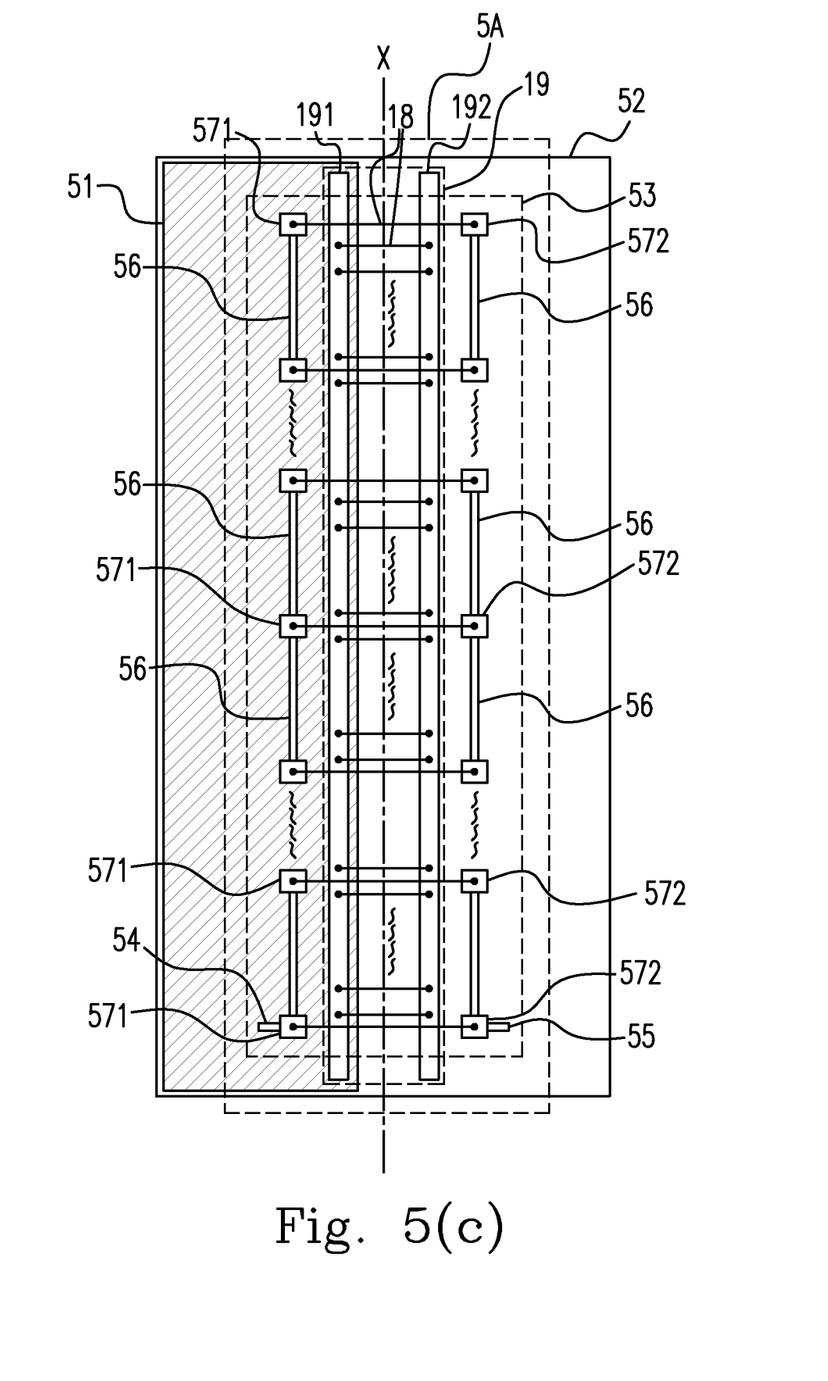

Please refer to FIGS. 5(*a*)-5(*c*), which show an interconnecting structure 5A according to a fifth embodiment of the present invention. The interconnecting structure 5A includes a signal transmission structure 53 and a ground device 19. The signal transmission structure 53 includes two transmission lines 56, a first signal input/output terminal 54, a second signal input/output terminal 55 and at least two bondwires 18 for transmitting the signal. The ground device 19 includes a first ground bond-pad 191, a second ground bond-pad 192 and at least one bondwire 18 for being connected to the ground. In FIG. 5(*a*), a first electronic device 51 is a chip, i.e. the rectangle represented by oblique lines, which includes two first bond-pads 571. A second electronic device 52 is a carrier, which includes two second bond-pads 572. Please refer to FIG. 5(*a*), which shows an example of a pair of transmission lines 56. The signal transmission structure 53 is disposed between the first electronic device 51 and the second electronic device 52 for electrically connecting the first electronic device 51 with the second electronic device 52. In this embodiment, the transmission lines 56 are disposed on the first electronic device 51 and the second electronic device 52 respectively. As shown in FIG. 5(*a*), a pair of transmission lines 56 are symmetrically disposed with respect to the X line, wherein one transmission line 56 is electrically connected between the first bond-pads 571 of the first electronic device 51, and the other is electrically connected between the second bond-pads 572 of the second electronic device 52. The first signal input/output terminal 54 is electrically connected to the first bond-pad 571 at the lower side of the interconnecting structure 5A. The second signal input/output terminal 55 is electrically connected to the second bond-pad 572 at the lower side of the interconnecting structure 5A. The first signal input/output terminal 54 and the second input/output terminal 55 are used to input and output the signal. The first bond-pads 571 on the first electronic device 51 are connected to the second bond-pads 572 on the second electronic device 52 via at least one bond-wire 18. Please refer to FIG. 5(*b*). In FIG. 5(*b*), two pairs of transmission lines 56 are symmetrically disposed with respect to the X line. In this embodiment, the respective dispositions of the first signal input/output terminal 54 and the second input/output terminal 55 are identical to those in FIG. 5(*a*). Please refer to FIG. 5(*c*), which shows an example of N pairs of transmission lines 56. In FIG. 5(*c*), N pairs of transmission lines 56 are symmetrically disposed with respect to the X line. That is, N transmission lines 56 are disposed between (N+1) first bond-pads 571, and N transmission lines 56 are also disposed between (N+1) second bond-pads 572. In this embodiment, the respective dispositions of the first signal input/output terminal 54 and the second input/output terminal 55 are identical to those in FIG. 5(*a*). In FIGS. 5(*a*)-5(*c*), the ground device 19 is disposed on the first electronic device 51 and the second electronic device 52. The ground device 19 includes one first ground bond-pad 191 and one second ground bond-pad 192. The first ground bond-pad 191 on the first electronic device 51 is connected to the second ground bond-pad 192 on the second electronic device 52 via at least one bond-wire 18. The ground device 19 can cause the ground potential of the first electronic device 51 to be equal to that of the second electronic device 52.

Figure 6A:
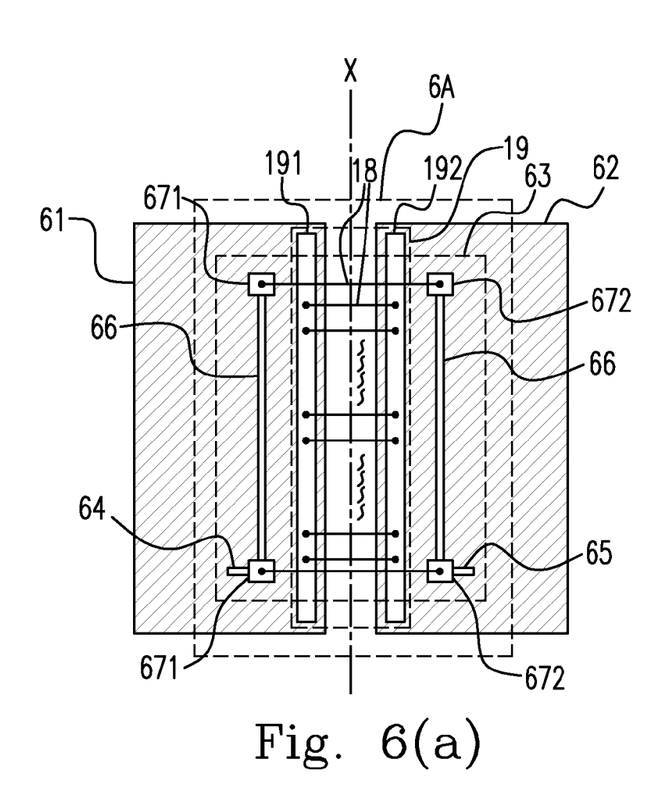
FIGS. 6(a)-6(c) show an interconnecting structure according to a sixth embodiment of the present invention.
Figure 6B:
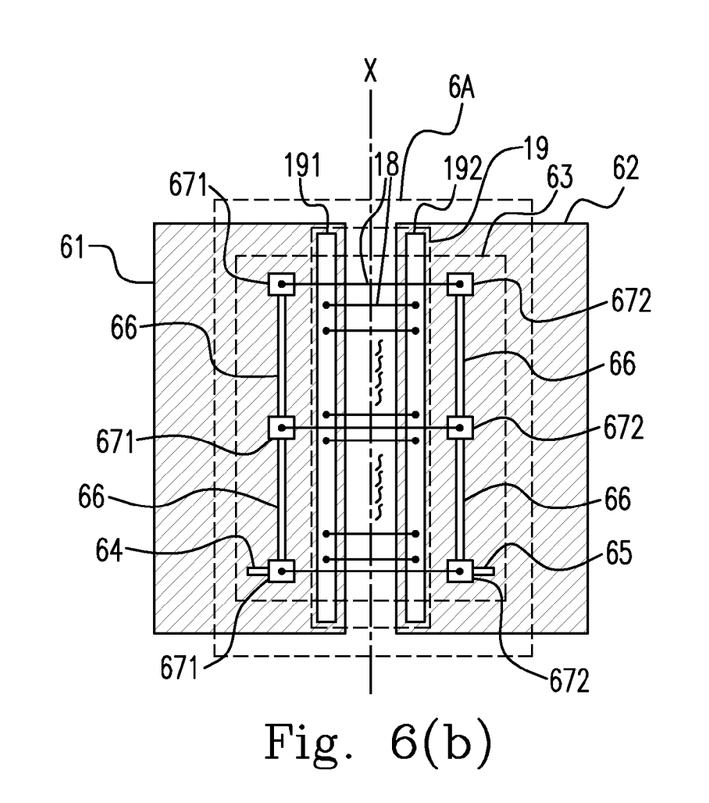
Figure 6C:
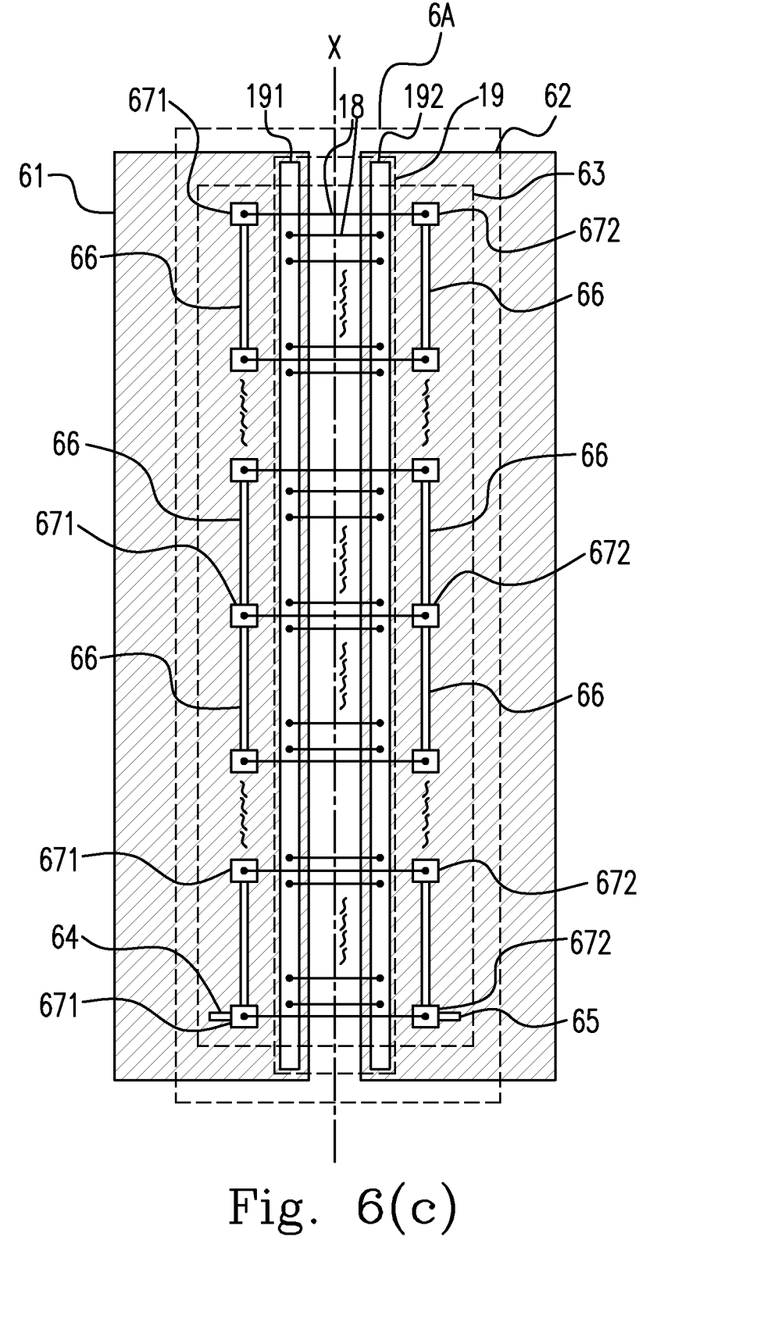

Please refer to FIGS. 6(*a*)-6(*c*), which show an interconnecting structure 6A according to a sixth embodiment of the present invention. The interconnecting structure 6A includes a signal transmission structure 63 and a ground device 19. The signal transmission structure 63 includes two transmission lines 66, a first signal input/output terminal 64, a second signal input/output terminal 65 and at least two bondwires 18 for transmitting the signal. The ground device 19 includes a first ground bond-pad 191, a second ground bond-pad 192 and at least one bondwire 18 for being connected to the ground. In FIG. 6(*a*), a first electronic device 61 and a second electronic device 62 are both chips, i.e. the two rectangles represented by oblique lines. The first electronic device 61 includes two first bond-pads 671, and the second electronic device 62 includes two second bond-pads 672. Please refer to FIG. 6(*a*), which shows an example of a pair of transmission lines 66. The signal transmission structure 63 is disposed between the first electronic device 61 and the second electronic device 62 for electrically connecting the first electronic device 61 with the second electronic device 62. In this embodiment, the transmission lines 66 are disposed on the first electronic device 61 and the second electronic device 62 respectively. As shown in FIG. 6(*a*), a pair of transmission lines 66 are symmetrically disposed with respect to the X line, wherein one transmission line 66 is electrically connected between the first bond-pads 671 of the first electronic device 61, and the other is electrically connected between the second bond-pads 672 of the second electronic device 62. The first signal input/output terminal 64 is electrically connected to the first bond-pad 671 at the lower side of the interconnecting structure 6A. The second signal input/output terminal 65 is electrically connected to the second bond-pad 672 at the lower side of the interconnecting structure 6A. The first signal input/output terminal 64 and the second input/output terminal 65 are used to input and output the signal. The first bond-pads 671 on the first electronic device 61 are connected to the second bond-pads 672 on the second electronic device 62 via at least one bond-wire 18. Please refer to FIG. 6(*b*). In FIG. 6(*b*), two pairs of transmission lines 66 are symmetrically disposed with respect to the X line. In this embodiment, the respective dispositions of the first signal input/output terminal 64 and the second input/output terminal 65 are identical to those in FIG. 6(*a*). Please refer to FIG. 6(*c*), which shows an example of N pairs of transmission lines 66. In FIG. 6(*c*), N pairs of transmission lines 66 are symmetrically disposed with respect to the X line. That is, N transmission lines 66 are disposed between (N+1) first bond-pads 671, and N transmission lines 66 are also disposed between (N+1) second bond-pads 672. In this embodiment, the respective dispositions of the first signal input/output terminal 64 and the second input/output terminal 65 are identical to those in FIG. 6(a). In FIGS. 6(a)-6(c), the ground device 19 is disposed on the first electronic device 61 and the second electronic device 62. The ground device 19 includes one first ground bond-pad 191 and one second ground bond-pad 192. The first ground bond-pad 191 on the first electronic device 61 is connected to the second ground bond-pad 192 on the second electronic device 62 via at least one bond-wire 18. The ground device 19 can cause the ground potential of the first electronic device 61 to be equal to that of the second electronic device 62.

The interconnecting structure of the present invention can be applied to the wireless communication, the wired communication, the automotive electronics, and the electronic industry requiring the packaging or the high-speed chip-to-chip or chip-to-carrier signal transmission, e.g. the cellphone, the automotive collision avoidance radar, the microwave image device, the point-to-point high-speed data transmission device, etc.

Embodiments

1. An interconnecting structure for electrically connecting a first electronic device with a second electronic device, wherein the first electronic device has two first bond-pads, and the second electronic device has two second bond-pads electrically connected to the two first bond-pads respectively, comprising a signal transmission structure electrically connected to the two first bond-pads and the two second bond-pads; and a ground device disposed between the first electronic device and the second electronic device so that the first electronic device and the second electronic device have a same ground potential.
2. The interconnecting structure of Embodiment 1, wherein the ground device includes a first ground bond-pad electrically connected to the first electronic device.
3. The interconnecting structure of any one of Embodiments 1-2, wherein the ground device further includes a second ground bond-pad electrically connected to the second electronic device.
4. The interconnecting structure of any one of Embodiments 1-3, wherein the ground device further includes at least one first bondwire connected to a ground, and electrically connected to the first ground bond-pad and the second ground bond-pad.
5. The interconnecting structure of any one of Embodiments 1-4, wherein the signal transmission structure further includes a first transmission line disposed between the two first bond-pads, and having a first central node.
6. The interconnecting structure of any one of Embodiments 1-5, wherein the signal transmission structure further includes a second transmission line disposed between the two second bond-pads, and having a second central node.
7. The interconnecting structure of any one of Embodiments 1-6, wherein the signal transmission structure further includes a first signal input/output terminal disposed on the first central node and transmitting a signal.
8. The interconnecting structure of any one of Embodiments 1-7, wherein the signal transmission structure further includes a second signal input/output terminal disposed on the second central node and transmitting the signal.
9. The interconnecting structure of any one of Embodiments 1-8, wherein the signal transmission structure further includes at least two second bondwires transmitting the signal, and electrically connected to the two first bond-pads and the two second bond-pads respectively.
10. An electronic device for being electrically connected to an electronic element, wherein the electronic device has two first bond-pads, and the electronic element has two second bond-pads electrically connected to the two first bond-pads respectively, comprising a signal transmission structure electrically connected to the two first bond-pads and the two second bond-pads.
11. The electronic device of Embodiment 10, wherein the electronic element is a chip.
12. The electronic device of any one of Embodiments 10-11, wherein the electronic element is a carrier.
13. An interconnecting structure for electrically connecting a first electronic device with a second electronic device, wherein the first electronic device has two first bond-pads, and the second electronic device has two second bond-pads electrically connected to the two first bond-pads respectively, comprising a ground device disposed between the first electronic device and the second electronic device so that the first electronic device and the second electronic device have a same ground potential.
14. The interconnecting structure of Embodiment 13, wherein the ground device includes a first ground bond-pad electrically connected to the first electronic device.
15. The interconnecting structure of any one of Embodiments 13-14, wherein the ground device further includes a second ground bond-pad electrically connected to the second electronic device.
16. The interconnecting structure of any one of Embodiments 13-15, wherein the ground device further includes at least one ground bondwire electrically connected to the first ground bond-pad and the second ground bond-pad.
17. A method for electrically connecting a first electronic device with a second electronic device, wherein the first electronic device has a first ground potential and the second electronic device has a second ground potential, comprising steps of causing the first ground potential to be equal to the second ground potential; providing N transmission lines and (N+1) first bond-pads in the first electronic device, wherein the N transmission lines are disposed between the (N+1) first bond-pads, and N is a positive integer; providing M transmission lines and (M+1) second bond-pads in the second electronic device, wherein the M transmission lines are disposed between the (M+1) second bond-pads, and M is equal to N; and electrically connecting the (N+1) first bond-pads with the (M+1) second bond-pads respectively.
18. The method of Embodiment 17, further comprising a step of providing a first signal input/output terminal.
19. The method of any one of Embodiments 17-18, wherein when N is larger than 2, the (N+1) first bond-pads are disposed between the N transmission lines, and the first signal input/output terminal is disposed on one of the (N+1) first bond-pads.
20. The method of any one of Embodiments 17-19, wherein the method further includes a step of providing a second signal input/output terminal; and when M is larger than 2, the (M+1) second bond-pads are disposed between the M transmission lines, and the second signal input/output terminal is disposed on the second bond-pad opposite to the first bond-pad on which the first signal input/output terminal is disposed.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An interconnecting structure for electrically connecting a first electronic device with a second electronic device, wherein the first electronic device has at least two first bond-pads, and the second electronic device has at least two second bond-pads, comprising:
    a signal transmission structure having a first transmission line disposed between the at least two first bond-pads, and having a first central node, wherein the at least two first bond-pads respectively connect to the at least two second bond-pads via a connection structure; and
    a ground device disposed between the first electronic device and the second electronic device so that the first electronic device and the second electronic device have a same ground potential.

2. An interconnecting structure as claimed in claim 1, wherein the ground device includes a first ground bond-pad electrically connected to the first electronic device.

3. An interconnecting structure as claimed in claim 2, wherein the ground device further includes a second ground bond-pad electrically connected to the second electronic device.

4. An interconnecting structure as claimed in claim 3, wherein the ground device further includes at least one first bondwire connected to the ground, and electrically connected to the first ground bond-pad and the second ground bond-pad.

5. An interconnecting structure as claimed in claim 1, wherein the signal transmission structure further includes a second transmission line disposed between the at least two second bond-pads, and having a second central node.

6. An interconnecting structure as claimed in claim 5, wherein the signal transmission structure further includes a first signal input/output terminal disposed on the first central node for transmitting a signal.

7. An interconnecting structure as claimed in claim 6, wherein the signal transmission structure further includes a second signal input/output terminal disposed on the second central node for transmitting the signal.

8. An interconnecting structure as claimed in claim 7, wherein the connection structure further includes at least two second bondwires for transmitting the signal, and electrically connected to the two first bond-pads and the at least two second bond-pads respectively.

* * * * *